United States Patent [19]

Brooks et al.

[11] Patent Number: 5,283,580
[45] Date of Patent: Feb. 1, 1994

[54] CURRENT/RESISTOR DIGITAL-TO-ANALOG CONVERTER HAVING ENHANCED INTEGRAL LINEARITY AND METHOD OF OPERATION

[75] Inventors: Todd L. Brooks; Mathew A. Rybicki; H. Spence Jackson, all of Austin, Tex.

[73] Assignee: Motorola, Inc., Schaumburg, Ill.

[21] Appl. No.: 951,958

[22] Filed: Sep. 28, 1992

[51] Int. Cl.$^5$ .............................................. H03M 1/68
[52] U.S. Cl. .................................. 341/145; 341/153; 341/154
[58] Field of Search ................ 341/144, 145, 153, 154

[56] References Cited

U.S. PATENT DOCUMENTS

| | | | |
|---|---|---|---|
| 4,491,825 | 1/1985 | Tuthill | 341/145 |
| 4,581,600 | 4/1986 | Ito et al. | 341/145 |
| 4,873,525 | 10/1989 | Iida | 341/145 |

Primary Examiner—Howard L. Williams
Attorney, Agent, or Firm—Robert L. King

[57] ABSTRACT

A digital-to-analog converter (10) uses series-connected resistors (55-59) to implement conversion of most significant bits of a digital input signal to an equivalent analog output signal. Current sources (22-26) are used to implement conversion of least significant bits of the digital input signal to the analog output signal. After making a binary-to-thermometer code conversion of the least significant bits, first logic circuitry (70) provides control signals (SI) for controlling the switching of each of the current sources to either a first (42) or a second (44) node. After making a binary to 'one of' code conversion of the most significant bits, second logic circuitry (86) provides control signals (SR) for respectively switching the first and second nodes to any two resistor nodes of the resistors. The resistors are connected between a reference voltage terminal and a third node where the analog output signal is developed.

12 Claims, 2 Drawing Sheets

CURRENT/RESISTOR DIGITAL-TO-ANALOG CONVERTER HAVING ENHANCED INTEGRAL LINEARITY AND METHOD OF OPERATION

CROSS REFERENCE TO RELATED APPLICATION

This application is related to our copending patent application entitled "A Monotonic Current/Resistor Digital-To-Analog Converter And Method of Operation", Ser. No. 07/951,956, filed of even date herewith and assigned to the assignee hereof, now U.S. Pat. No. 5,243,347.

FIELD OF THE INVENTION

The present invention generally relates to data conversion, and more specifically to digital-to-analog (D/A) converters.

BACKGROUND OF THE INVENTION

There are a variety of known Digital-to-Analog (D/A) converters which convert a signal in digital form to analog form. One particular type of D/A converter is a current D/A converter which utilizes current sources controlled by a digital input signal value which is being converted into an analog equivalent. Current D/A converters utilize resistors to translate a current provided by the current sources into a voltage.

Each current source can be implemented to provide a predetermined value of current. In one form, each current source provides a different amount of current, each value being a binary two multiple. Such converters are commonly said to be binarily weighted. In another form, each current source may be implemented to provide the same amount of current, wherein the D/A converter is called a monotonic converter. Monotonic converters require more current sources than binarily weighted converters to implement the same amount of resolution. However, binarily weighted converters are often not monotonic. Monotonic converters are characterized by the fact that when increasing input signal values are provided to the converter, the output never decreases in value. Binarily weighted converters are not typically monotonic because of error in precisely implementing each current source value. Due to the fact that current source values may vary over a wide range, it is possible that in binarily weighted current source converters that an output value can decrease when an input code is actually increased (i.e. non-montonic). The lack of monotonicity is very undesirable in many control applications in which D/A converters find wide usage. However, for higher resolution requirements, a monotonic converter having $2^N$ equal valued current sources as opposed to N binarily weighted current sources may be prohibitive in size largely due to the size of an associated binary-to-thermometer digital decoder. The amount of erroneous variation in output value between two successive input codes is commonly referred to as differential nonlinearity. The maximum deviation in output value, for all code values, from the predetermined ideal output value with the corresponding input code is referred to as the integral nonlinearity. In contrast with the differential nonlinearity, the integral nonlinearity of a monotonic data converter typically results from a summation of erroneous output signal variations between several successive input codes. A data converter will have perfect differential and integral linearity if the change in output signal for successive input codes is always equal to a predetermined amount. This occurs when each component value, such as a current source value, is precise and has an expected value. Because process and manufacturing variations typically result in some degree of component variation, known data converters have a certain amount of differential and integral nonlinearity.

SUMMARY OF THE INVENTION

In accordance with the invention, there is provided a digital-to-analog converter and a method for converting a digital signal having (N+M) bits, where N and M are integers, to an equivalent analog signal. The N bits are converted to a first code conversion signal, the N bits being least significant bits of the digital signal. A plurality of current sources, each current source providing a predetermined current is coupled to a first reference voltage terminal. A first portion of the current sources is coupled to a first node and a second portion of the current sources is coupled to a second node in response to the first code conversion signal. A second code conversion of the M bits is performed to provide a control signal, the M bits being most significant bits of the digital signal. A plurality of series connected resistors is connected between a second reference voltage terminal and a third node. The first node is selectively connected to one of the second reference voltage terminal or a first portion of the series connected resistors in response to the control signal. The second node is selectively connected to a second portion of the series connected resistors in response to the control signal to develop the equivalent analog signal at the third node.

These and other features, and advantages, will be more clearly understood from the following detailed description taken in conjunction with the accompanying drawings. It is important to point out that there may be other embodiments of the present invention which are not specifically illustrated.

DETAILED DESCRIPTION OF A PREFERRED EMBODIMENT

Figure 1:
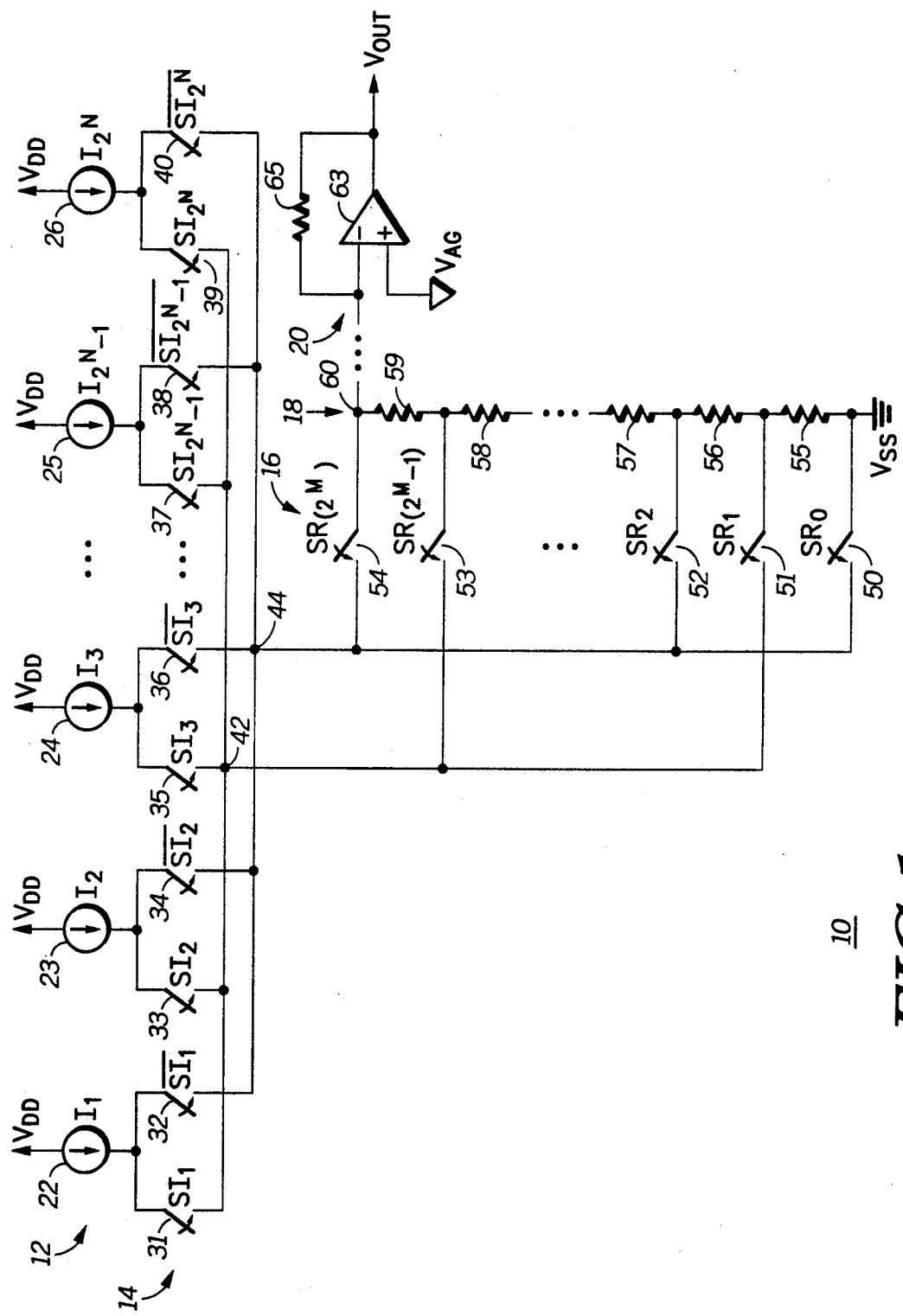
FIG. 1 illustrates in partial schematic form a digital-to-analog converter in accordance with the present invention.

Shown in FIG. 1 is a digital-to-analog converter 10 which functions to convert a digital input signal having (M+N) total bits, where M and N are each an integer value, to an equivalent analog signal value. Digital-to-analog converter 10 generally has a current source portion 12, a first switching portion 14, a second switching portion 16, a resistor ladder portion 18, and an output portion 20. Current source portion 12 has a plurality of $2^N$ current sources 22–26, which respectively provide currents I1 thru I2N. If converter 10 is linear, then each of currents I1 thru I2N is equal in value. Each of current sources 22–26 has a first terminal connected to a power supply voltage terminal for receiving a positive power supply voltage, $V_{DD}$. Each of current sources 22–26 also has a second terminal.

The first switching portion 14 has a plurality of $2^N$ pairs of switches which are represented in FIG. 1 by a plurality of switches 31–40. Each of switches 31–40 is controlled by a specific control signal, SI, or a complement thereof. Switch 31 has a first terminal connected to the second terminal of current source 22, and has a second terminal connected to a node 42. Switch 32 has a first terminal connected to the second terminal of current source 22, and has a second terminal connected to a node 44. Switch 33 has a first terminal connected to the second terminal of current source 23, and has a second terminal connected to node 42. Switch 34 has a first terminal connected to node 44. Switch 35 has a first terminal has a second terminal connected to node 44. Switch 35 has a first terminal connected to the second terminal of current source 24, and has a second terminal connected to node 42. Switch 36 has a first terminal connected to the second terminal of current source 24, and has a second terminal connected to node 44. Switch 37 has a first terminal connected to the second terminal of current source 25, and has a second terminal connected to node 42. Switch 38 has a first terminal connected to the second terminal of current source 25, and has a second terminal connected to node 44. Switch 39 has a first terminal connected to the second terminal of current source 26, and has a second terminal connected to node 42. Switch 40 has a first terminal connected to the second terminal of current source 26, and has a second terminal connected to node 44. Control signal $SI_1$ controls switch 31 and the complement thereof controls switch 32. Control signal $SI_2$ controls switch 33 and the complement thereof controls switch 34. Control signal $SI_3$ controls switch 35 and the complement thereof controls switch 35, and so on thru switches 39 and 40.

The second switching portion 16 has a plurality of switches 50–54, each switch having first and second terminals and a control terminal. In general, the second switching portion 16 has $[2^{(M)}+1]$ total switches. A predetermined one of $[2^{(M)}+1]$ control signals controls a predetermined one of the $[2^{(M)}+1]$ switches. Switch 50 has a first terminal connected to node 44, a second terminal connected to a power supply voltage terminal labeled $V_{SS}$, and a control terminal for receiving a control signal labeled $SR_0$. Switch 51 has a first terminal connected to node 42, a second terminal, and a control terminal for receiving a control signal labeled $SR_1$. Switch 52 has a first terminal connected to node 44, a second terminal, and a control terminal for receiving a control signal labeled $SR_2$. Switch 53 has a first terminal connected to node 42, a second terminal, and a control terminal for receiving a control signal labeled $SR_{[2(M)-1]}$. Switch 54 has a first terminal connected to node 44, a second terminal, and a control terminal for receiving a control signal labeled $SR_{[2(M)]}$.

Resistor ladder portion 18 has a plurality of resistors 55, 56, 57, 58 and 59. Resistor 55 has a first terminal connected to the $V_{SS}$ power supply terminal, and has a second terminal connected to the second terminal of switch 51. Resistor 56 has a first terminal connected to the second terminal of resistor 55, and has a second terminal connected to the second terminal of switch 52. Resistor 57 has a first terminal connected to the second terminal of switch 52, and has a second terminal connected to circuitry not specifically illustrated. The magnitude of M may be any predetermined integer. In the illustrated form, the magnitude of $(_2M)$ may be any predetermined number which depends upon the number of MSB bits, M, used in a specific D/A converter implementation as is illustrated by the dashed line between resistors 57 and 58. In the event that M is two requiring four resistors in the resistor ladder portion 18, one of the five resistors of FIG. 1 is not implemented. In one form of the case where M is two, resistors 57 and 58 may be replaced by a single resistor. In FIG. 1 which accommodates additional resistors which are not specifically illustrated, resistor 58 has a first terminal connected to circuitry not specifically illustrated, and has a second terminal which is connected to the second terminal of switch 53. Resistor 59 has a first terminal connected to the second terminal of resistor 58, and has a second terminal connected to the second terminal of switch 54 at a node 60.

In one form, the output of converter 10 may be used as a voltage which is generated at node 60. This voltage may be buffered or amplified by a buffer circuit (not illustrated) to provide an analog output signal.

In another form indicated by a dashed line in FIG. 1, node 60 is connected directly to output portion 20. Output portion 20 has an operational amplifier 63 having a first or negative input connected to node 60, a second or positive input connected to an analog ground voltage terminal for receiving an analog ground voltage $V_{AG}$. Operational amplifier 63 also has an output for providing an analog output voltage labeled $V_{OUT}$. A feedback resistor 65 has a first terminal connected to the negative input of operational amplifier 63, and has a second terminal connected to the output of operational amplifier 63.

Figure 2:
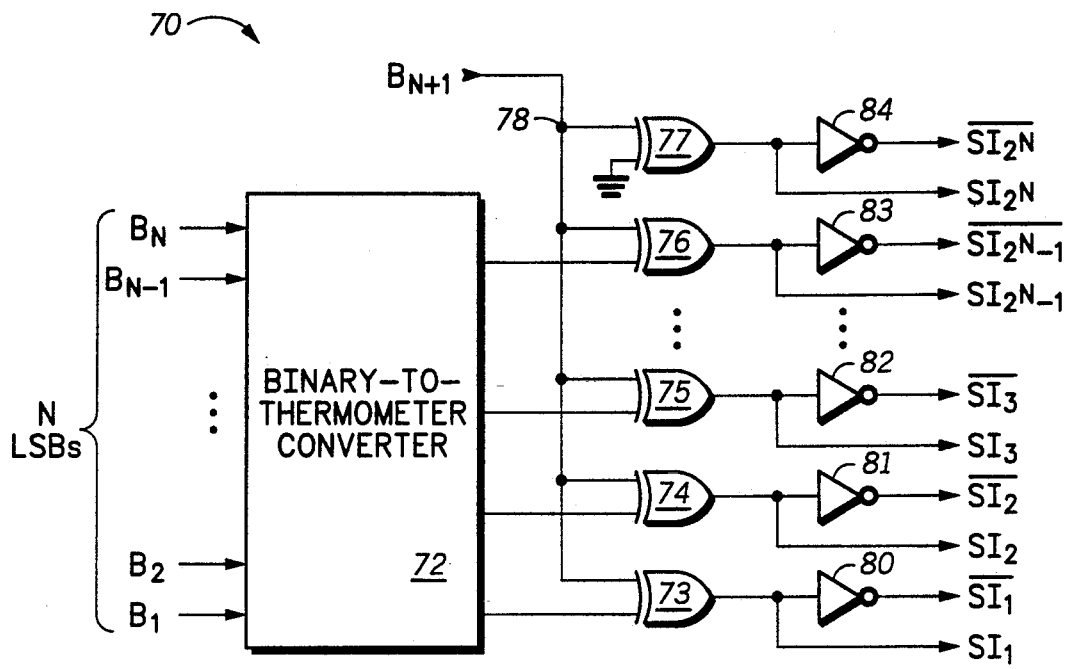
FIG. 2 illustrates in partial logic diagram form control circuitry for controlling a first portion of the converter of FIG. 1.

In operation, digital-to-analog converter 10 provides a less expensive implementation of monotonic digital-to-analog converters and provides improved integral linearity performance as compared with conventional digital-to-analog converters implemented fully with current sources. A digital input signal having a total of $(M+N)$ bits is initially manipulated by segregating M most significant bits (MSBs) of the signal from N least significant bits (LSBs). Shown in FIG. 2 is a first control portion 70 having a conventional binary-to-thermometer converter 72 for receiving the N LSBs. For purposes of illustration, the N LSBs are designated by bits B1, B2, ... $B_{(N-1)}$, $B_N$. In response to the N input bits, $[(2^N)-1]$ output bits are provided. For purposes of facilitating an understanding of converter 72, an example of the conventional binary-to-thermometer code is provided in table one for three input bits.

TABLE 1

| Binary Input | Thermometer Output |
|---|---|
| 000 | 0000000 |
| 001 | 0000001 |
| 010 | 0000011 |
| 011 | 0000111 |
| 100 | 0001111 |
| 101 | 0011111 |
| 110 | 0111111 |
| 111 | 1111111 |

Further illustrated in FIG. 2 is a plurality of exclusive OR gates 73–77, each having a first input connected to a bit $B_{(N+1)}$ which is the least significant bit position of the (M) MSBs. A second input of each of exclusive OR gates 73–76 is connected to a predetermined one of the $[(2^N)-1]$ output bits of converter 72. A second input of exclusive OR gate 77 is connected to a ground reference terminal for providing a logic zero or logic low input. Exclusive OR gate 77 functions to buffer the bit $B_{(N+1)}$. It should be noted that other circuitry may be used to accomplish this function. In a preferred form, an exclusive OR gate is used since exclusive OR gates 73-76 are used so that the timing of providing the control signals $SI_1$, $SI_2$, $SI_3$, ... $SI_{[(2N)-1]}$, and $S_{l2}N$ is substantially identical. Each of exclusive OR gates 73-77 has an output for respectively providing control signals $SI_1$, $SI_2$, $SI_3$, ... $SI_{[(2N)-1]}$, and $S_{l2}N$. Control signals $SI_1$, $SI_2$, $SI_3$, $SI_{[(2N)-1]}$ and $S_{l2}N$ respectively control switches 31, 33, 35, 37 and 39, and the complements of these same control signals respectively control switches 32, 34, 36, 38, and 40.

Figure 3:
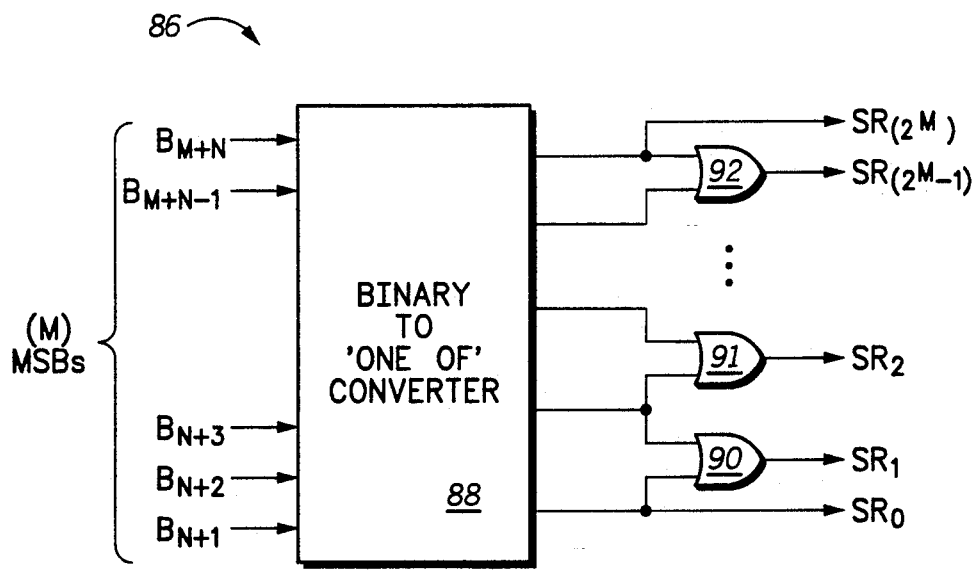
FIG. 3 illustrates in partial logic diagram form additional control circuitry for controlling a second portion of the converter of FIG. 1.

Illustrated in FIG. 3 is a second control portion 86 having a conventional binary to 'one of' converter 88 for receiving the (M) MSBs of the digital input signal. The (M) MSBs are labeled $B_{(N+1)}$ thru $B_{(M+N)}$. For purposes of facilitating an understanding of binary to 'one of' converter 88, an example of the implemented conversion is provided in table two for two input bits which result in four output signals.

TABLE 2

| BINARY INPUT | 'ONE OF' OUTPUT |
|---|---|
| 00 | 0 0 0 1 |
| 01 | 0 0 1 0 |
| 10 | 0 1 0 0 |
| 11 | 1 0 0 0 |

For (M) digital inputs there are $2^{(M)}$ outputs provided. A first output of binary to 'one of' converter 88 provides a control signal labeled $SR_0$ which is also connected to a first input of an OR gate 90. A second input of OR gate 90 is connected to a second output of binary to 'one of' converter 88 and to a first input of an OR gate 91. An output of OR gate 90 provides a control signal labeled $SR_1$. A second input of OR gate 91 is connected to a third output of binary to 'one of' converter 88. An output of OR gate 91 provides a control signal labeled $SR_2$. A $[2^{(M)}-1]$th output of binary to 'one of' converter 88 is connected to a first input of an OR gate 92. A $2^{(M)}$th output provides a control signal labeled $SR_2(M)$ and is connected to a second input of OR gate 92. An output of OR gate 92 provides a control signal labeled $[2^{(M)}-1]$.

The digital-to-analog conversion provided by converter 10 of FIG. 1 is divided into an MSB section controlled by switches 50-54 and an LSB section controlled by switches 31-40. Current source portion 12 provides current to one of either node 42 or node 44. For each switch pair, such as switches 31, 32, only one switch is conductive so that the current from any one current source is only directed to node 42 or to node 44. Second switching portion 16 connects nodes 42 and 44 to resistor portion 18. Initially assume that no digital input signal is input to converter 10. Switches 32, 34, 36, 38 and 40 are all conductive and switches 50 and 51 are conductive. All other switches are nonconductive. As the digital input signal which is coupled to converters 72 and 88 increases from a zero value, current sources 22-26 are sequentially switched, beginning with current source 22, from node 44 to node 42. When control signal $SR_0$ is active, control signal $SR_1$ is also active which makes switches 50 and 51 conductive. During this time current is directed thru resistor 55 to $V_{SS}$. Assume initially that output portion 20 is not connected to resistor string portion 18. The increasing current thru resistor 55 results in an increasing voltage at the second terminal of resistor 59. During this time no current is conducted by resistors 56-59. When the digital input signal reaches a magnitude that causes all of switches 31, 33, 35, 37, and 39 to be conductive, converter 88 changes output state. Control signal $SR_0$ is no longer active and control signals $SR_1$ and $SR_2$ become active. As a result, switch 50 is nonconductive and switches 51 and 52 are conductive. Because bit $B_{N+1}$ is used by first control portion 70, the outputs of exclusive OR gates 77-73 sequentially become inactive (i.e. logic low) as the digital input signal continues to increase in value. The effect of this circuit operation is that current sources 26-22 are sequentially switched, beginning with current source 26, from node 42 to node 44 which is connected to the second terminal of resistor 56. As the digital input signal increases in value, the sequential switching action just described continues so that current sources 22-26 are sequentially switched in numerically increasing order into node 42 from node 44, and then current sources 26-22 are sequentially switched in numerically decreasing order into node 44 from node 42. For each completion of successive switching of current sources 22-26 or successive switching of current sources 26-22, switches 50-54 advance up resistor ladder portion 18 by having only two adjacent switches conductive at any one point in time for one digital input signal value. At a maximum input code value, switches 53 and 54 are conductive and $(2^N)-1$ current sources are connected to node 60 while current source 26 is connected to the first terminal of resistor 59. In this manner exclusive OR gates 73-77 of first control portion 70 function to select the direction that current sources 22-26 are switched. As the digital input code increases, current from current source portion 12 is directed into an increasingly larger portion of resistor ladder portion 18. The net effect of this circuit operation is to provide a directly proportional increasing analog voltage at the second terminal of resistor 59 which is equivalent to the digital input code.

Assume now that output portion 20 is directly connected to the second terminal of resistor 59. The circuit operation thru resistor ladder portion 18 is modified. Because operational amplifier 63 has the effect of making the second terminal of resistor 59 a virtual ground node equal in voltage to $V_{AG}$, current coupled into resistor ladder portion 18 above the $V_{SS}$ terminal will divide. A portion of the current will be conducted to the negative input of operational amplifier 63 and the remaining current will be conducted to the $V_{SS}$ terminal. As the current is switched into higher nodes or taps of the resistor ladder, an increasing portion of the current will be conducted to the negative input of operational amplifier 63. The increased portion of current is directly proportional to the value of the digital input signal and is conducted through resistor 65 and is converted into a proportional voltage, $V_{OUT}$.

The present invention provides a digital-to-analog converter which provides improved integral linearity in a monotonic area-efficient architecture as discussed below. If converter 10 is used to implement an (M+N) bit digital-to-analog conversion having N least significant bits and M most significant bits, converter 10 requires $2^N$ current sources and $2^M$ resistors. For example, an eight-bit implementation having four least significant bits and four most significant bits requires only sixteen current sources and sixteen resistors. In contrast, an equivalent conventional monotonic current source implementation requires two hundred fifty-six ($2^8$) current sources.

Another advantage of the present invention is that current source mismatch does not significantly degrade integral linearity. An error in the value of a current source in digital-to-analog converter 10 will only cause an erroneous variation in output value between two successive input codes. In contrast, an error in a resistor value will cause erroneous variations in output value for several successive input codes. The summation of erroneous variations in output values caused by the resistor mismatch will typically be much greater than the single erroneous variation caused by a current source mismatch. The integral linearity of digital-to-analog converter 10 is primarily determined by the accuracy of resistor value matching. In contrast, the integral linearity of a conventional current source digital-to-analog converter is determined by the accuracy of current source matching. Resistor value matching is typically superior to current source matching of similar size. For this reason, digital-to-analog converter 10 has significantly better integral linearity than a conventional digital-to-analog converter utilizing a similarly sized current source array.

Thus it is apparent that there has been provided, in accordance with the present invention, a digital-to-analog converter that fully meets the needs and advantages set forth previously. Although the invention has been described and illustrated with reference to specific embodiments thereof, it is not intended that the invention be limited to these illustrative embodiments. For example, one may reverse the polarity of power supplies and direction of current flow from that shown in FIG. 1. Although the present invention may implement a linear converter, it should be well understood that the same advantages are provided for a non-linear converter which results if resistors of differing values and/or current sources of differing values are implemented. Any number of resistors and current sources may be implemented depending upon the degree of resolution desired. It should also be apparent that the output of each of first control portion 70 and second control portion 86 may be considered to be a single control signal having a plurality of bits, such as $SI_1$ and $SI_2$, or may be considered to be a plurality of control signals, each control signal being a single signal such as $SI_1$ and $SI_2$, etc.. Converter 10 is guaranteed to be monotonic, limited only by the finiteness of current source output resistance as compared with switch resistance. It should also be readily apparent that the switches of converter 10 may be implemented with any type of electronic device which performs a gating function. Those skilled in the art will recognize that modifications and variations can be made without departing from the spirit of the invention. Therefore, it is intended that this invention encompass all such variations and modifications as fall within the scope of the appended claims.

We claim:

1. A method of converting a digital signal having (N+M) bits, where N and M are integers, to an equivalent analog signal, comprising the steps of:
    performing a first code conversion by converting the N bits to a first code conversion signal, the N bits being the least significant bits of the digital signal;
    providing a plurality of current sources, each current source a predetermined current;
    coupling a first portion of the current sources to a first node and coupling a second portion of the current sources to a second node in response to the first code conversion signal;
    performing a second code conversion of the M bits to provide a control signal, the M bits being the most significant bits of the digital signal;
    providing a plurality of series-connected resistors connected between a first reference voltage terminal and a third node and defining a plurality of intermediate nodes therebetween inclusive of said first reference voltage terminal and said third node;
    selectively connecting the first node to one of the intermediate nodes in response to the control signal; and
    selectively connecting the second node to one of the intermediate nodes in response to the control signal.

2. The method of claim 1 further comprising the step of:
    coupling an output stage to the third node to convert the equivalent analog signal from a current to a voltage.

3. The method of claim 1 further comprising the step of:
    coupling an output stage to the third node to buffer the equivalent analog signal.

4. A digital-to-analog converter for converting a digital input signal having (N+M) bits, where N and M are integers, to an equivalent analog signal, comprising:
    first conversion logic circuitry for converting the N bits to a first plurality of control signals, the N bits being the least significant bits of the digital signal;
    a plurality of current sources, each current source providing a predetermined current and having a first terminal coupled to a first reference voltage terminal;
    a first plurality of switches, each switch having a first terminal coupled to a predetermined one of the current sources and having a second terminal coupled to one of a first node or a second node in response to the first plurality of control signals;
    second conversion logic circuitry for converting the M bits to a second plurality of control, the M bits being the most significant bits of the digital signal;
    a plurality of series-connected resistors connected between a second reference voltage terminal and a third node and defining a plurality of intermediate nodes therebetween inclusive of said second reference voltage terminal and said third node; and
    a second plurality of switches, each switch having a first terminal coupled to only one of the first or the second node and having a second terminal coupled to the series-connected resistors, two switches of the second plurality of switches respectively selectively connecting the first node and the second node to respective differing ones of said intermediate nodes in response to the second plurality of control signals to develop the equivalent analog signal at the third node.

5. The digital-to-analog converter of claim 4 further comprising:
    an output stage coupled to the third node, the output stage converting the equivalent analog signal from a current to a voltage.

6. The digital-to-analog converter of claim 5 wherein the output stage is a buffer circuit.

7. The digital-to-analog converter to claim 5 wherein the output stage further comprises:
- an operational amplifier having a first input coupled to the third node, a second input coupled to a third reference voltage terminal, and an output for providing the equivalent analog signal; and
- a resistor having a first terminal coupled to the first input of the operational amplifier, and a second terminal coupled to the output of the operational amplifier.

8. The digital-to-analog converter of claim 4 wherein the plurality of current sources further comprises current sources which each provide a substantially equal amount of current and the plurality of series-connected resistors each have a substantially equal amount of resistance.

9. The digital-to-analog converter of claim 4 wherein the plurality of current sources comprises $2^N$ current sources and the plurality of series-connected resistors comprise $2^M$ resistors.

10. A digital-to-analog converter for converting a digital input signal having (N+M) bits, where N and M are integers, N being least significant bits and M being most significant bits of the digital input signal, to an analog output signal, comprising:
- first conversion means for receiving the N bits, converting the N bits to thermometer code, and generating a first group of control signals having a plurality of true and complementary signals;
- second conversion means for receiving the M bits, implementing a binary to 'one of' conversion, and generating a second group of control signals;
- a plurality of current sources, each current source having a first terminal connected to a first voltage terminal, and a second terminal;
- a plurality of pairs of switches, each switch having first, second and control terminals, each pair of switches having the first terminals thereof connected to the second terminal of a predetermined respective one of the current sources, a first switch of each pair of switches having a second terminal connected to a first node and having a control terminal for receiving a predetermined one of the true signals of the first group of control signals, and a second switch of each pair of switches having a second terminal connected to a second node and having a control terminal for receiving a predetermined one of the complementary signals of the first group of control signals;
- a plurality of rank ordered switches, each switch having a first terminal connected to one of the first node or the second node and successively alternating between the first node and the second node by rank, having a second terminal, and having a control terminal for receiving one of the second group of control signals; and
- a plurality of series-connected resistors connected between a second reference voltage terminal and a third node, the series-connected resistors forming a plurality of nodes, each node being connected to the second terminal of a predetermined one of the plurality of rank ordered switches, the third node providing the analog output signal.

11. The digital-to-analog converter of claim 10 further comprising:
- an operational amplifier having a first input connected to the third node, a second input connected to a third reference voltage terminal, and an output; and
- a feedback resistor having a first terminal connected to first input of the operational amplifier, and having a second terminal connected to the output of the operational amplifier.

12. The digital-to-analog converter of claim 10 further comprising a buffer circuit coupled to the third node, for buffering the analog output signal.

* * * * *